(12) United States Patent
Ledieu et al.

(10) Patent No.: US 11,128,085 B2
(45) Date of Patent: Sep. 21, 2021

(54) SEALING SYSTEM FOR ELECTRICAL EQUIPMENT

(71) Applicant: Valeo Siemens eAutomotive Germany GmbH, Erlangen (DE)

(72) Inventors: Cédric Ledieu, Mont Saint Eloi (FR); Jean-Claude Labrosse, Charenton le Pont (FR)

(73) Assignee: VALEO SIEMENS EAUTOMOTIVE GERMANY GMBH, Erlangen (DE)

( * ) Notice: Subject to any disclaimer, the term of this patent is extended or adjusted under 35 U.S.C. 154(b) by 0 days.

(21) Appl. No.: 16/713,294

(22) Filed: Dec. 13, 2019

(65) Prior Publication Data
US 2020/0194927 A1 Jun. 18, 2020

(30) Foreign Application Priority Data
Dec. 14, 2018 (FR) ...................................... 1872974

(51) Int. Cl.
| | | |
|---|---|---|
| H01R 13/52 | (2006.01) | |
| H02G 15/013 | (2006.01) | |
| H02K 5/22 | (2006.01) | |
| H05K 5/06 | (2006.01) | |
| H02K 5/10 | (2006.01) | |

(52) U.S. Cl.
CPC ....... *H01R 13/5205* (2013.01); *H02G 15/013* (2013.01); *H02K 5/22* (2013.01); *H05K 5/069* (2013.01); *H02K 5/10* (2013.01)

(58) Field of Classification Search
CPC .... H01R 13/5205; H02G 15/013; H02K 5/22; H05K 5/069
See application file for complete search history.

(56) References Cited

U.S. PATENT DOCUMENTS

| | | | | |
|---|---|---|---|---|
| 2005/0026489 A1* | 2/2005 | Ferderer | ............ | H01R 13/5205 439/275 |
| 2008/0020634 A1* | 1/2008 | Taniguchi | .......... | H01R 13/5205 439/578 |

FOREIGN PATENT DOCUMENTS

| | | |
|---|---|---|
| CA | 481856 A | 3/1952 |
| CN | 206992854 U | 2/2018 |
| EP | 1883147 A2 | 1/2008 |

(Continued)

OTHER PUBLICATIONS

French Search Report for Application No. 1872974 dated Sep. 3, 2019.

*Primary Examiner* — William H. Mayo, III
*Assistant Examiner* — Rhadames Alonzo Miller
(74) *Attorney, Agent, or Firm* — McCormick, Paulding & Huber PLLC (57) ABSTRACT

The subject matter of the present invention is a sealing system configured to form a leak tight electrical connection on a face of an electrical equipment, said sealing system including:
a base, comprising a first plate, comprising a through orifice of which the edge is continually comprised in a face of said first plate, a plug comprising a second plate comprising at least one through hole, configured for the passage of at least one electric wire, and a part projecting from said plate suited to being inserted into the orifice, a face of the second plate coming against a face of the first plate,
said plug having a flexibility greater than the flexibility of the base, such that the difference in flexibility ensures a constraining of the second plate on the first plate, in such a way as to ensure the sealing of the electrical equipment.

20 Claims, 9 Drawing Sheets

(56) References Cited

FOREIGN PATENT DOCUMENTS

| JP | 2005045904 A | 2/2005 |
|----|--------------|--------|
| JP | 2012075253 A | 4/2012 |

* cited by examiner

SEALING SYSTEM FOR ELECTRICAL EQUIPMENT

CROSS-REFERENCE TO RELATED APPLICATION

This application claims foreign priority benefits under 35 U.S.C. § 119 to French Patent Application No. 1872974 filed on Dec. 14, 2018, the content of which is hereby incorporated by reference in its entirety.

TECHNICAL FIELD

The present invention relates to the field of electrical equipment, and more specifically electrical machines used for vehicles.

The invention notably aims to enable the sealing of electrical equipment, notably for a vehicle.

BACKGROUND

Figure 1:
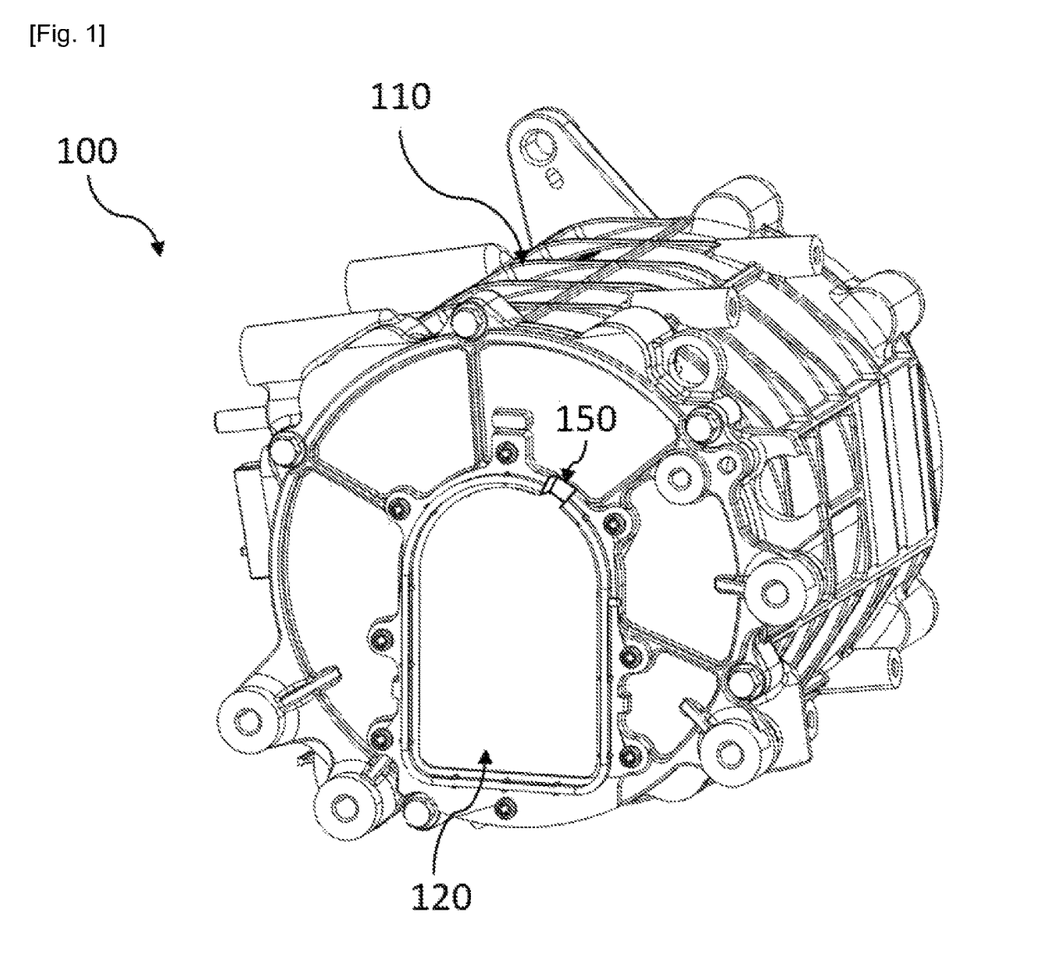
FIG. 1 (already commented on) illustrates a diagram of an electrical equipment according to the prior art.
Figure 2:
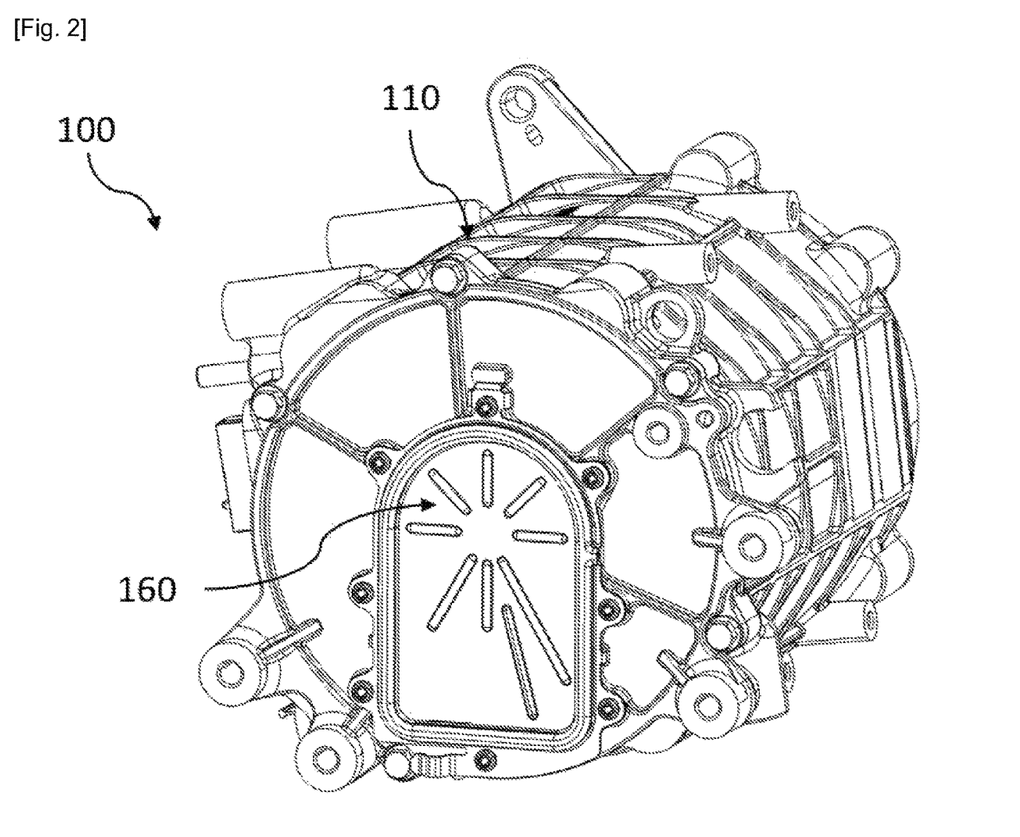
FIG. 2 (already commented on) illustrates a diagram of an electrical equipment according to the prior art.

FIGS. 1 and 2 represent an electrical equipment 100 conforming to the prior art. Such an electrical equipment 100 includes a frame in which is arranged a cavity 110, for example cylindrical, comprising the active part of the electrical equipment 100.

The cavity 110 is closed by a cover 160. The electrical equipment 100 includes a bearing 120, at the interface between the outside and the inside of the cavity 110. Said bearing 120 includes a housing, also closed by the cover 160, said housing being configured to house sensors connected to the inside of the cavity 110.

Still with reference to FIGS. 1, 2, 3, and 4, a cable 130 connected to a sensor or to a device situated in the housing or inside the cavity 110, connects the electrical equipment 100 to a second electrical equipment. Thus, the cable 130 makes it possible for example to transmit to this second electrical equipment information measured by sensors present in the housing, concerning the active part of the electrical equipment 100.

This information makes it possible for example to control more efficiently the electrical equipment 100 and/or to detect a malfunction relating to this electrical equipment 100.

In a known manner, the cable 130 must notably reach the cavity 110 and the housing arranged in the bearing 120 in order to connect the sensors and the second electrical equipment outside of said cavity 110. To this end, the cable 130 intrudes between said cover 160 and the bearing 120.

Figure 3:
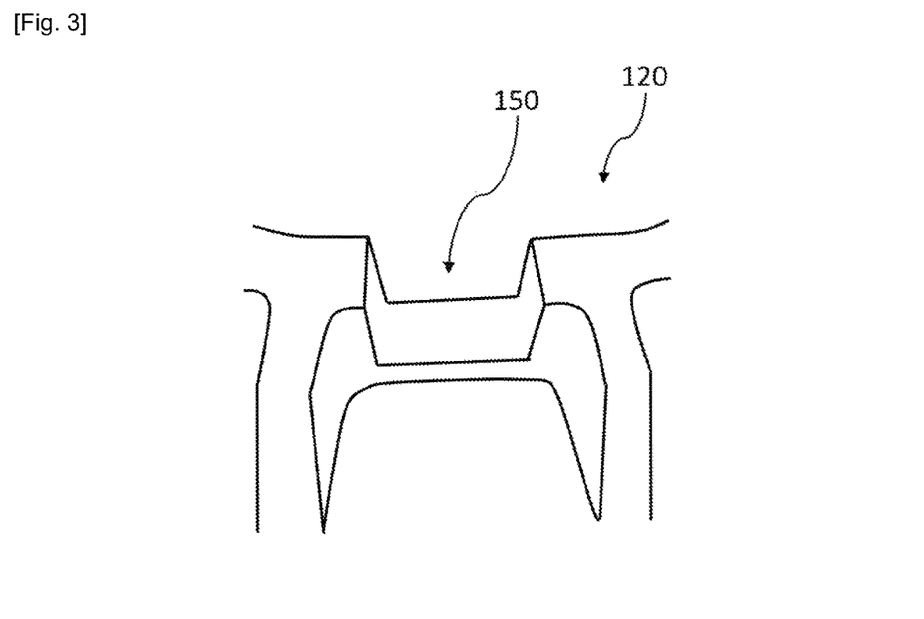
FIG. 3 (already commented on) diagrammatically illustrates a passage arranged on the periphery of an electrical equipment bearing according to the prior art.
Figure 4:
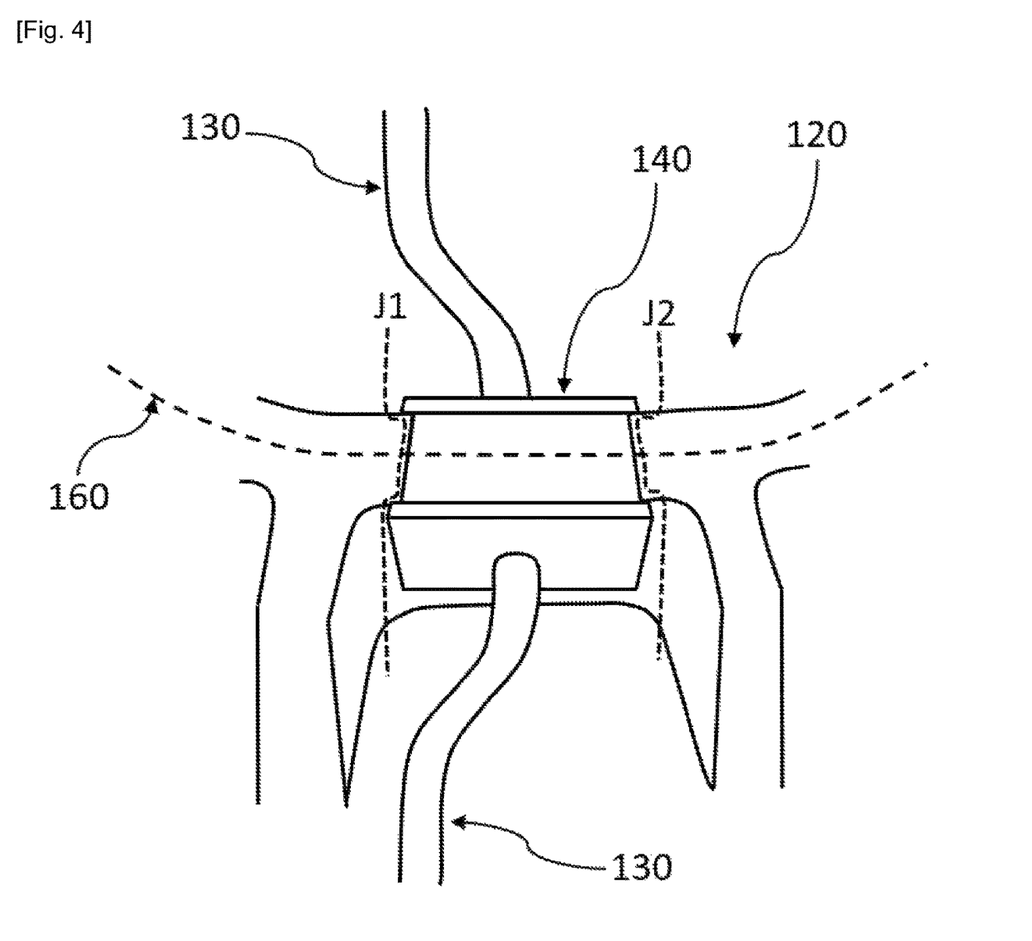
FIG. 4 (already commented on) diagrammatically illustrates a leak tight seal placed in a passage represented in FIG. 3 according to the prior art.

To do so, with reference to FIGS. 1, 2 and 3, according to the prior art, the cable 130 is inserted into a seal 140 made of rubber, said seal 140 being suited to next being inserted and adjusted in a passage 150 arranged on the periphery of the bearing 120. Next, the cover 160, notably provided with its own seal, is fixed to the bearing 120 and covers the seal 140 inserted into the passage 150. The seal of the cover 160 is thus supported against the seal 140 provided to enable the passage of the cable 130 and adjusted in the passage 150.

The seal of the cover 160 makes it possible to ensure the sealing of the cavity 110 in order to protect the active part of the electrical equipment 100. However, in the present case, the seal includes a double junction.

Indeed, a first junction J1 is situated between the bearing 120 and the seal 140 and a second junction J2 is situated between the seal 140 and the bearing 120.

The elements situated on either side of the first junction J1 and the second junction J2 are composed of different materials. There is thus a difference in compression between the seal of the cover 160 and the bearing 120 on the one hand, where there is contact between a "hard" surface and a "flexible" surface (that of the seal of the cover 160) compared to the compression between the seal of the cover 160 and the seal 140, where there is contact between two "flexible" surfaces. This difference in compression may cause sealing problems in the cavity 110, notably on account of liquid run-off by capillarity along at least one cable 130 or between the seal 140 and the seal of the cover 160.

This represents a major drawback since the cavity 110 must imperatively be leak tight to avoid any risk of deterioration of an element of the active part of the electrical equipment 100.

Another possible solution to this technical problem is notably to install connectors on the wall of the cavity 110, which make it possible to ensure the sealing of the cavity 110 when at least one cable 130 is installed in said connector. However, this solution is very expensive, around ten or so euros per connector.

There thus exists the need for an economic solution making it possible to ensure the sealing of the cavity when a cable traverses said wall.

SUMMARY

More precisely, the invention targets a sealing system configured to form a leak tight electrical connection on a face of an electrical equipment, said sealing system comprising:
  a base, comprising a first plate, said plate comprising a through orifice, all the edge of the through orifice being continually comprised in a face of said first plate,
  a plug comprising a second plate comprising at least one through hole, configured to enable the passage of at least one electric wire, and a part projecting from said plate of the plug, said projecting part being suited to being inserted into the orifice of the base, a face of the second plate of the plug coming against a face of the first plate of the base,
said plug having a flexibility greater than the flexibility of the base, such that when the sealing system is positioned on a face of the electrical equipment and during a supporting of the plate of the plug on the plate of the base, the difference in flexibility ensures a constraining of the second plate of the plug on the first plate of the base, in such a way as to ensure a compression of the second plate of the plug contributing to the sealing of the electrical equipment.

Advantageously, according to an embodiment, the base and the plug of the sealing system are independent parts.

Preferably, the projecting part of the plug of the sealing system is configured to be forcibly mounted in the orifice of the base.

In a preferred manner, according to another embodiment, the base and the plug of the sealing system constitute a single block and are integral with each other.

Preferably, the base and the plug of the sealing system form an independent assembly configured to be transferred onto a frame of the electrical equipment.

The invention also relates to an electrical equipment comprising a sealing system, said sealing system forming a leak tight electrical connection on a face of said electrical equipment.

In a preferred manner, the electrical equipment includes a cover transferred onto said face of the electrical equipment so as to close at least in part said electrical equipment, a portion of said cover abutting on said second plate of the plug at least against a closed line describing the periphery of said second plate of the plug.

Advantageously, said cover of the electrical equipment includes a through opening, of which the edges come continually at least against said closed line describing the periphery of said second plate of the plug, in such a way as to surround said at least one hole of the second plate of the plug.

Preferably, the electrical equipment includes a bearing forming a part of the frame of said electrical equipment, said bearing having a first housing containing said sealing system.

According to a first embodiment, the base of the electrical equipment is a part different from the bearing and is transferred into the first housing.

Advantageously, a peripheral wall of said first housing of the electrical equipment has a notch extending from an opening of the first housing through which the plug is received in said first housing, said notch being configured to enable the passage of the at least one electric wire to the inside of the electrical equipment during mounting of the plug in said first housing.

According to another embodiment, the electrical equipment includes a sealing system in which the base is integral with the bearing or is produced in one piece with the bearing.

Advantageously, the base of the electrical equipment is comprised in a bottom of the first housing receiving the plug.

According to yet another embodiment, the electrical equipment includes a sealing system according to the second embodiment.

The invention also relates to a method for sealing an electrical equipment, said method being configured to seal a cavity arranged in a bearing forming a part of the frame of said electrical equipment, the method comprising the steps:
- of insertion of the projecting part of the plug into the orifice of the base,
- of insertion of each cable of the bundle of cables into a hole of the plug,
- of insertion of the assembly comprising the plug, the base and the bundle of cables into the first housing of the bearing,
- of fixing the cover on the bearing such that the edges of the through opening of the cover are supported on the second plate of the plug.

BRIEF DESCRIPTION OF THE DRAWINGS

The invention will be better understood on reading the description that follows, given uniquely as an example, and by referring to the appended drawings given as non-limiting examples, in which identical references are given to similar objects and in which.

It should be noted that the figures set out the invention in a detailed manner for implementing the invention, said figures obviously being able to serve to better define the invention if needs be.

DETAILED DESCRIPTION

It is recalled that the present invention is described hereafter using different non-limiting embodiments and is liable to be implemented in alternatives within the reach of those skilled in the art, also targeted by the present invention.

Figure 5:
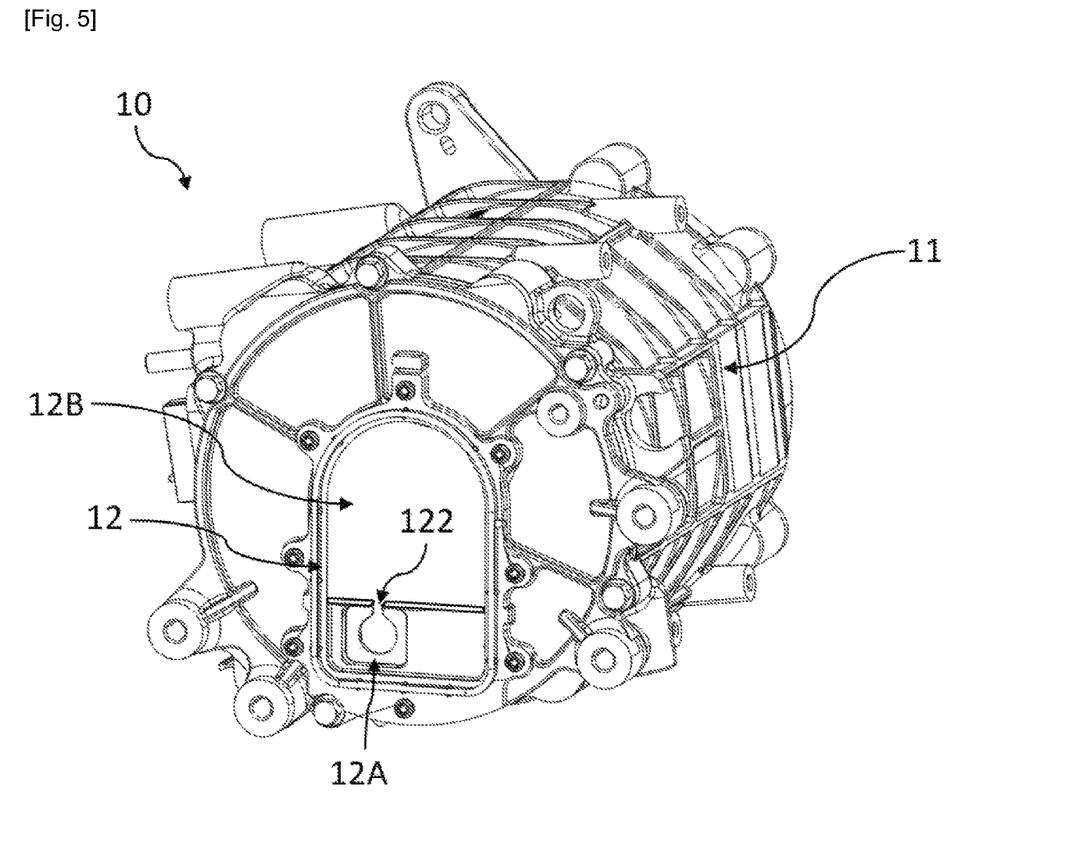
FIG. 5 represents the diagram of an electrical equipment according to the invention.

With reference to FIG. 5, an electrical equipment 10 for a vehicle has a frame in which is arranged a cavity 11, for example cylindrical, comprising an active part of the electrical equipment 10. For example, the electrical equipment 10 is an electrical machine. But the electrical equipment 10 may be an inverter, a DC-DC converter or an electric charger.

The cavity 11 is delimited by a bearing 12. A first housing 12A and a second housing 12B are arranged in the bearing 12. A cover 16 is placed and fixed on the bearing 12 so as to close said housings 12A, 12B.

Said first housing 12A makes it possible to receive a sealing system 20 forming a leak tight electrical connection according to an example of the invention. Said first housing 12A may be square, as represented in FIG. 5, or any other geometrical shape, In addition, a peripheral wall of said first housing 12A may have a notch 122, configured to enable the passage of one or more electric wires associated with the sealing system 20, from the outside of the electrical equipment 10 to the inside of the electrical equipment 10 during the mounting of the sealing system 20 in the electrical equipment 10, notably in the first housing 12A.

Said second housing 12B includes sensors for example making it possible to recover information characterising the active part of the electrical equipment 10. For example, in the case of a motor, the second housing 12B may include a position sensor making it possible to know the position of the rotor with respect to the stator and a temperature sensor measuring the temperature inside the cavity 11 (not represented).

The cover 16 closes the electrical equipment 10, notably the first housing 12A and the second housing 12B in a leak tight manner.

The electrical equipment 10 also includes one or more electric wires 13 penetrating inside the electrical equipment 10 at the level of the housing 12A of the bearing 12.

Indeed, each electric wire 13 is either connected between the active part and another electrical equipment outside of the electrical equipment 10 via the first housing 12A, or connected between a sensor and another electrical equipment outside of the electrical equipment 10, via the first housing 12A. Thus, the electric wire 13 enables the exchange of data between the electrical equipment 10 and other items of electrical equipment and makes it possible notably, for example, to transmit to these other items of electrical equipment information concerning the active part of the electrical equipment 10, measured by sensors, notably present in the second housing 12B. This information makes it possible for example to control more efficiently the electrical equipment 10 and/or to detect a malfunction concerning this electrical equipment 10.

According to an embodiment, the electrical equipment 10 may be a rotating electrical machine and the external electrical equipment may be an inverter making it possible to control said rotating electrical machine.

Figure 6:
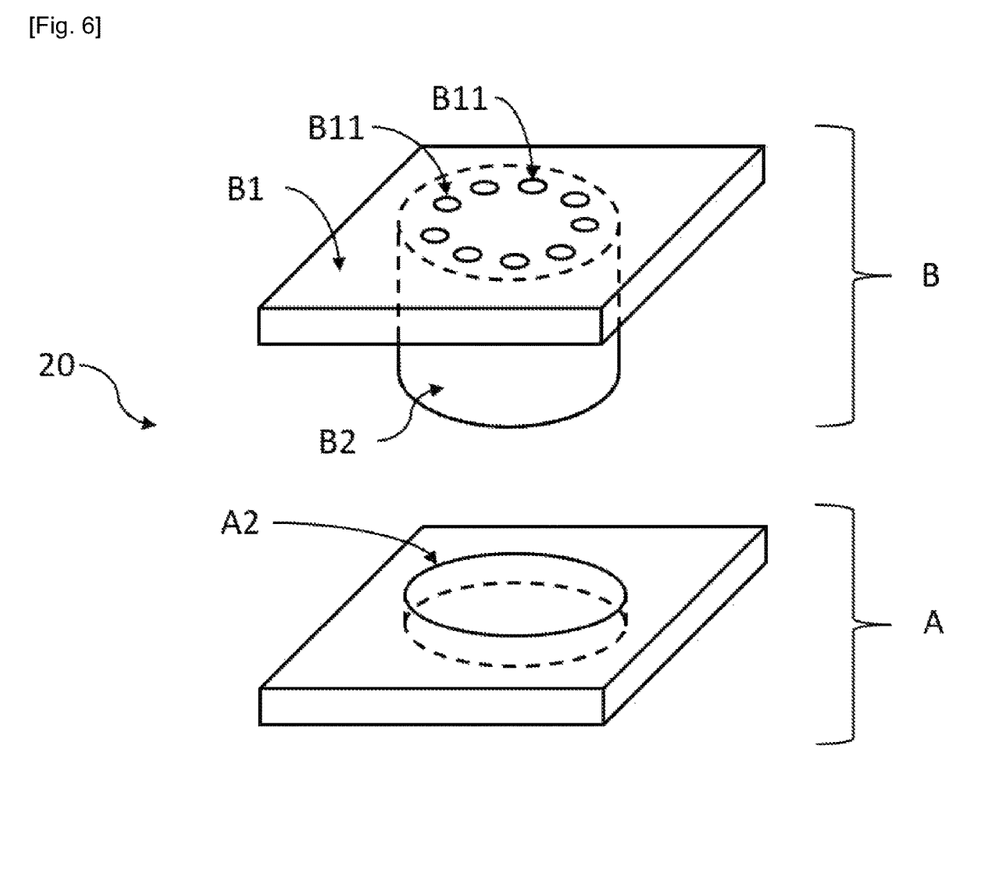
FIG. 6 illustrates a sealing system according to the invention.

With reference to FIG. 6, a first embodiment of a sealing system 20 making it possible to ensure the sealing of an electrical equipment 10 is represented, as described previously, notably in the zone of the passage of the electric wire 13 from the outside to the inside of the electrical equipment 10.

According to this first embodiment, said sealing system 20 includes two distinct elements. The sealing system includes a base A and a plug B.

The base A is in the form of a rigid and not very flexible part, for example made of plastic, of suitable geometric shape to be inserted in an adjusted manner into the bottom of the first housing 12A of the bearing 12. According to the example described with reference to FIG. 6, the base A is a plastic part of square shape. In addition, said base A includes a first plate A1 comprising a through orifice A2, for example cylindrical and positioned at the centre of the base A. All the edge of the through orifice A2 is continually comprised in a face of said first plate A1.

Still with reference to FIG. 6, the plug B is a part constituted of a flexible material, for example a part made of elastomer, the plug B having a flexibility greater than the flexibility of the base A. Said plug B includes a second plate B1 of which the dimensions are suited to enable the insertion of the plug B into the first housing 12A, notably to enable said insertion, for example in such a way that the plug B fills the whole of the first housing 12A.

The second plate B1 includes at least one through hole B11, as represented in FIG. 6, the at least one hole B11 is configured to enable the passage of at least one electric wire 13.

The second plate B1 may include several holes B11. According to the embodiment described, the number of holes B11 is equal to the number of electric wires 13. According to an embodiment, the holes B11 of the plug B have a transversal section less than the transversal section of each electric wire 13 traversing the sealing system 20. Notably, the diameter of each hole B11 is less than the diameter of each electric wire 13. In this way, when an electric wire 13 is inserted into a hole B11, no liquid can run off by capillarity along this electric wire 13 through this hole B11. A part of the sealing of the cavity 11 is thus ensured at the junction between each electric wire 13 and each hole B11 associated with said electric wire 13.

The plug B also includes a projecting part B2, of which the shape is suited so that the projecting part B2 is forcibly mounted in the empty space formed inside the orifice A2 of the base A. To ensure this forcible mounting, the dimensions of the projecting part B2 are for example equal to or greater than those of the orifice A2. Thus, the projecting part B2 of the plug B is inserted, in the manner of a plug, into the orifice A2. After insertion of the projecting part B2 into the orifice A2, a face of the second plate B1 of the plug B comes against a face of the first plate A1 of the base A. Thus, the base A enables the compression of the second plate B1 of the plug B thanks to the cover 16; once the plug B has been inserted into the base A, the projecting part B2 of the plug is thereby compressed in the orifice A2 of the base A.

Figure 7:
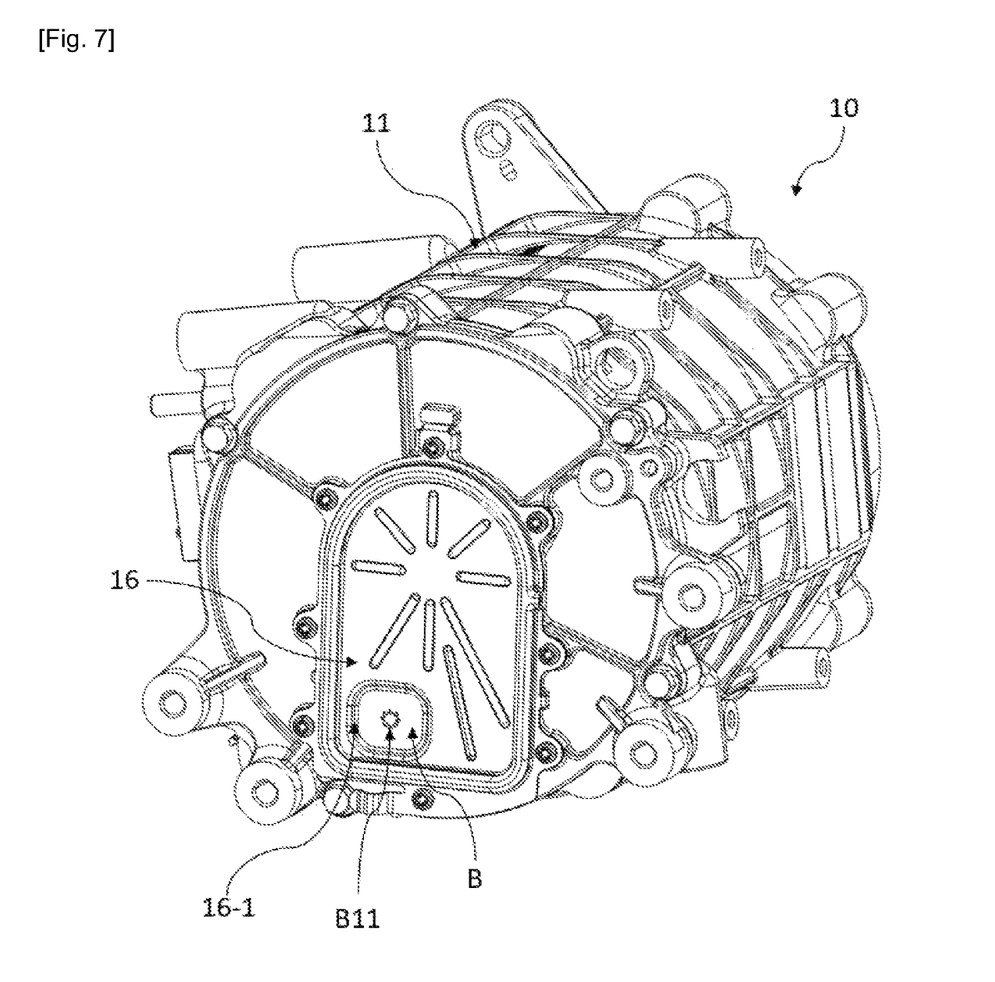
FIG. 7 represents an electrical equipment and a sealing system according to a first embodiment of the invention.

With reference to FIG. 7, the cover 16 of the electrical equipment 10 makes it possible to cover the second housing 12B in a leak tight manner by means of a seal (not represented) arranged between the bearing 12 and the cover 16 of the electrical equipment 10, notably on the periphery of the cover 16.

The cover 16 also includes a through opening 16-1, of which the edges are configured to be supported on the second plate B1 of the plug B, notably on the periphery of the second plate B1, and thereby ensure sealing at the level of the opening 16-1. A portion of said cover 16 is thereby supported on said plate B1 of the plug B against a closed line describing the periphery of said plate B1 of the plug B.

The plug B being constituted of a more flexible material than the base A, the pressing of the cover 16 onto the second plate B1 of the plug B ensures a compression of the second plate B1 of the plug B between the edges of the opening 16-1 and the first plate A1 of the base A, and consequently a sealing at the level of the passage of the electric wire 13. Unlike the prior art, the contact between the cover 16 and the bearing 12 is uniform, which improves the sealing.

Figure 8:
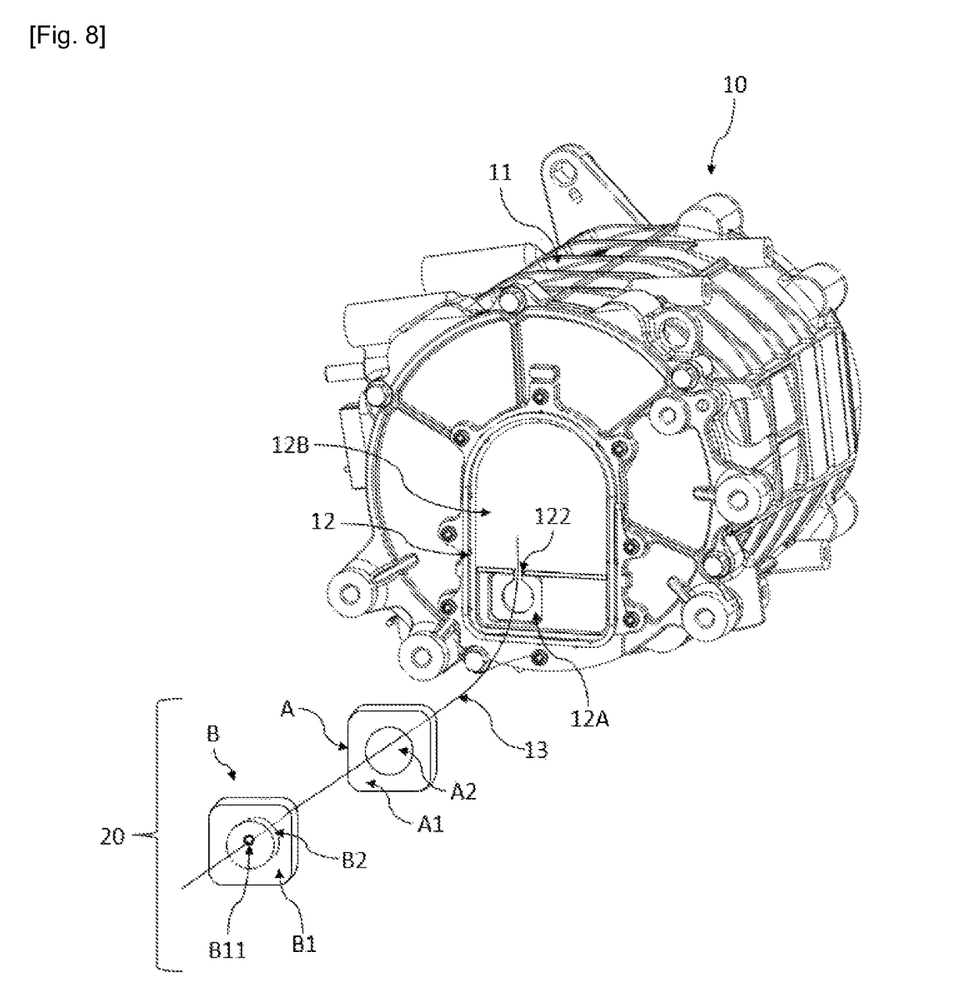
FIG. 8 represents an electrical equipment and a sealing system according to the first embodiment of the invention.

With reference to FIG. 8, the electrical equipment 10 as well as a sealing system 20 are represented, making it possible to describe a method for sealing an electrical equipment 10; to this end, a sealing system 20 is fixed on the electrical equipment 10, in accordance with a first embodiment of the invention.

In a first step of a method for sealing according to the invention, the projecting part B2 of the plug B is inserted into the orifice A2 of the base A. Thus, the plug B and the base A constitute an assembly of which the parts are integral with each other.

In a second step, each electric wire 13 is inserted into a hole B11 traversing the plug B. The first and the second step being able to be reversed.

Finally, in a third step, the assembly formed by the plug B, the base A and the electric wire(s) 13, is inserted into the first housing 12A of the bearing 12, such that the base A is inserted at the bottom of said first housing 12A and such that the electric wire(s) 13 access the inside of the electrical equipment 10, notably to the second housing 12B by passing through the notch 122 of the bearing 12. The assembly between these different elements is thus simple and rapid.

Finally, in a fourth step, the cover 16 is fixed on top of this assembly and the compression of the second plate B1, placed between the cover 16 and the base A, makes it possible to seal the electrical equipment 10 at the level of the electrical connection of the electrical equipment 10.

This assembly further makes it possible to ensure a double sealing at the level of the electrical connection of the electrical equipment 10. Firstly, the insertion of each electric wire 13 in a hole B11 makes it possible to ensure the sealing of the electric wires 13. Secondly, the sealing is also ensured by the compression of the edges of the opening 16-1 of the cover 16 on the outer part of the second plate B1 of the plug B against the base A, itself inserted into the first housing 12A.

Thus, the present invention enables a decoupling between the sealing of the passage of the electric wires 13 through the plug B and that of the electrical equipment 10.

Figure 9:
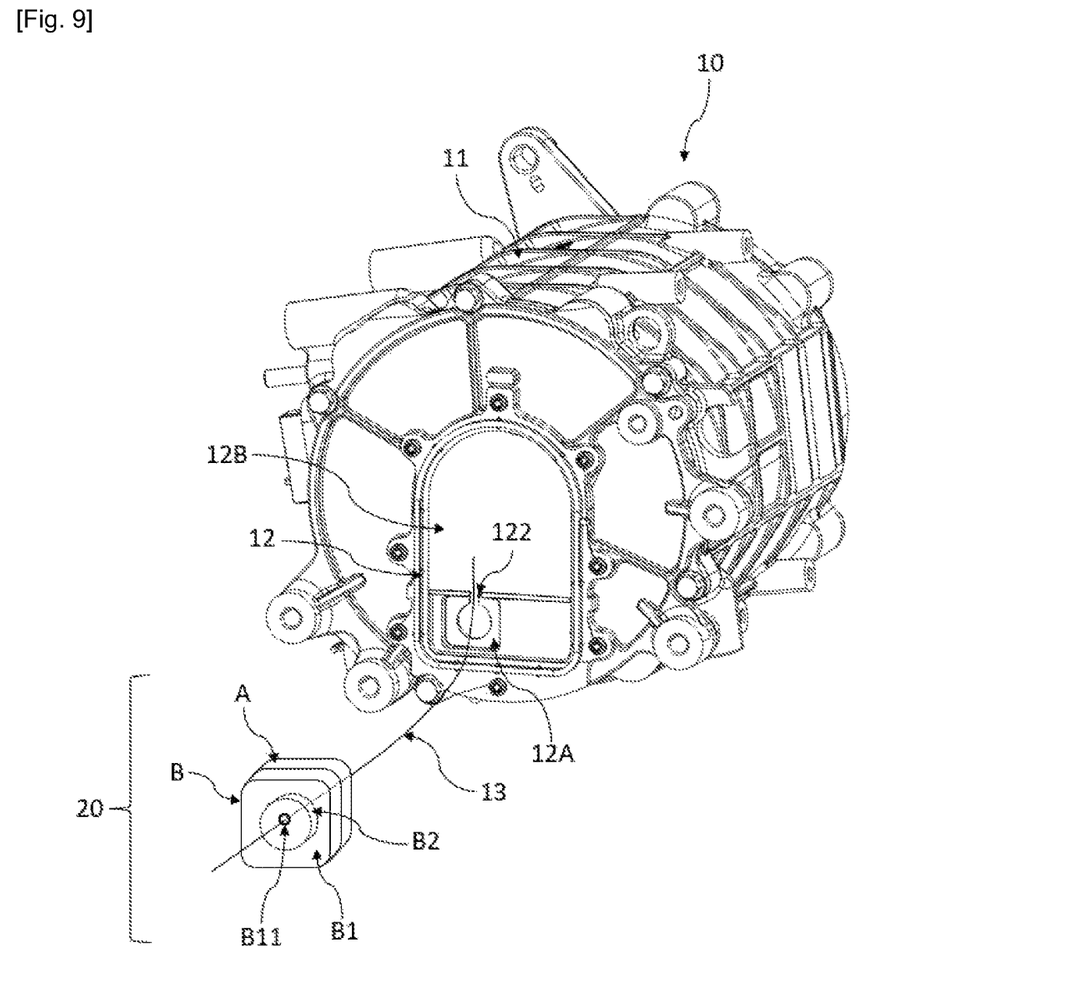
FIG. 9 represents an electrical equipment and a sealing system according to a second embodiment of the invention.

With reference to FIG. 9, a second embodiment is represented in which the base A is overmoulded on the plug B, with which it forms a monobloc assembly, that is to say integral one piece. The base A may also be overmoulded or not with the electric wire 13. The first housing 12A may have a notch 122, as in the first embodiment. The method for sealing of the second embodiment of the sealing system 20 includes the second, third and fourth steps of the method for sealing of the first embodiment.

Figure 10:
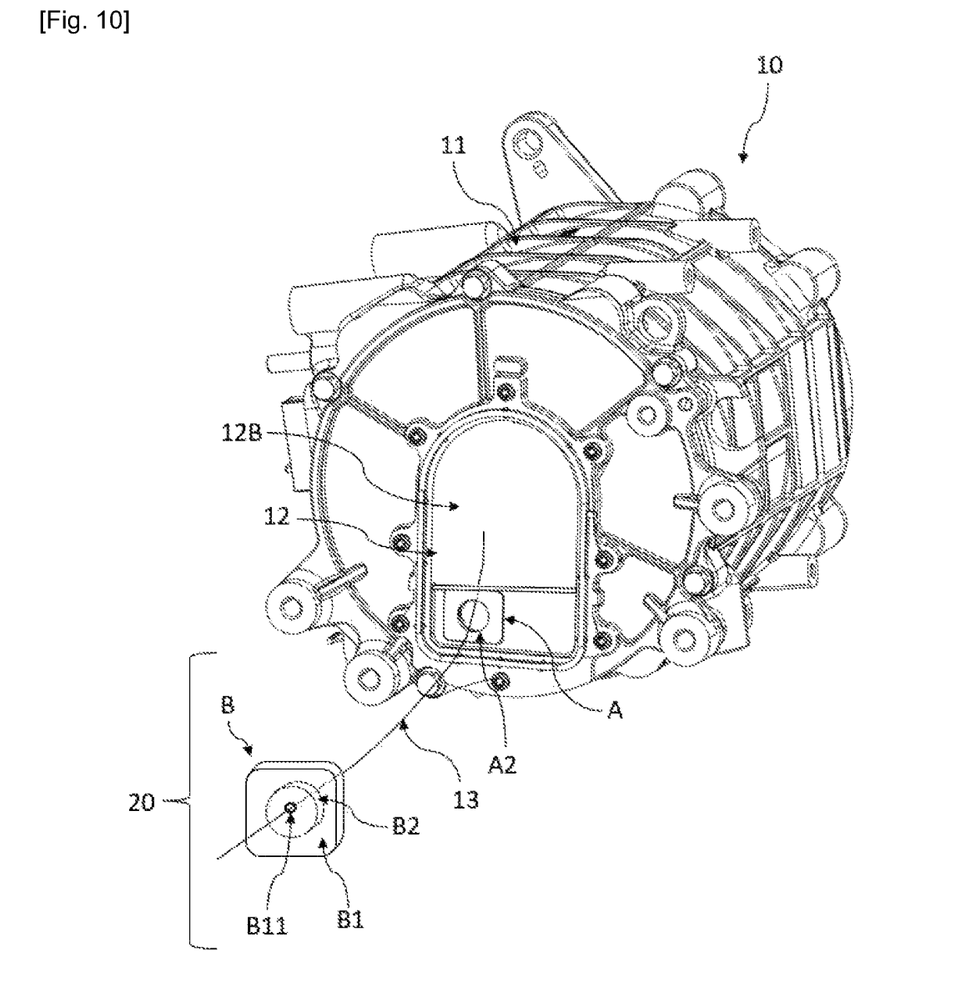
FIG. 10 represents an electrical equipment and a sealing system according to a third embodiment of the invention.

With reference to FIG. 10, a third embodiment is represented. According to this embodiment, the base A is made of the same material as the bearing 12. Put another way, the base A is formed by a bottom of the first housing 12A. In particular, the bearing 12 does not have a notch 122 as in the first embodiment. According to this third embodiment, the sealing method includes a first step during which the projecting part B2 of the plug B is inserted into the orifice A2 of the base A and a second step during which the cover 16 is fixed on top of the bearing 12.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A sealing system configured to form a leak tight electrical connection on a face of an electrical equipment, said sealing system comprising:
    a base, comprising a first plate, said first plate comprising a first side configured to contact the electrical equipment, a second side opposite the first side, and a through orifice extending from the first side to the second side, all the edge of the through orifice being continually comprised in a face of said first plate,
    a plug comprising a second plate comprising at least one through hole, configured to enable the passage of at least one electric wire, and a part projecting from said plate of the plug, said projecting part being configured to be inserted into the orifice of the base, a face of the second plate of the plug coming against a face of the second side of the first plate of the base,
    said plug having a flexibility greater than the flexibility of the base, such that when the sealing system is positioned on a face of the electrical equipment with the first side of the base contacting the electrical equipment and during the supporting of the plate of the plug on the plate of the base with the plate of the plug contacting the second side of the plate of the base, the difference in flexibility ensures a constraining of the second plate of the plug on the first plate of the base to ensure a compression of the second plate of the plug contributing to the sealing of the electrical equipment.

2. The sealing system according to claim 1, in which said base and said plug are independent parts.

3. The sealing system according to claim 2, in which said projecting part of the plug is configured to be forcibly mounted in the orifice of the base.

4. The sealing system according to claim 1, in which the base and the plug constitute a single block and are integral with each other.

5. The sealing system according to claim 1, in which the base and the plug form an independent assembly configured to be transferred onto a frame of the electrical equipment.

6. An electrical equipment comprising a sealing system according to claim 1, said sealing system forming a leak tight electrical connection on a face of said electrical equipment.

7. The electrical equipment according to claim 6, comprising a cover transferred onto said face of the electrical equipment so as to close at least in part said electrical equipment, a portion of said cover abutting on said second plate of the plug at least against a closed line describing the periphery of said second plate of the plug.

8. The electrical equipment according to claim 7, in which said cover includes a through opening, of which the edges come continually at least against said closed line describing the periphery of said second plate of the plug to surround said at least one hole of the second plate of the plug.

9. The electrical equipment according to claim 6, comprising a bearing forming a part of the frame of said electrical equipment, said bearing having a first housing containing said sealing system.

10. The electrical equipment according to claim 9, in which the base is a part different from the bearing and is transferred into the first housing.

11. The electrical equipment according to claim 10, in which a peripheral wall of said first housing has a notch extending from an opening of the first housing through which the plug is received in said first housing, said notch being configured to enable the passage of the at least one electric wire to the inside of the electrical equipment during a mounting of the plug in said first housing.

12. The electrical equipment according to claim 9, comprising a sealing system according to claim 1, in which the base is integral with the bearing or is produced in one piece with the bearing.

13. The electrical equipment according to claim 12, in which the base is comprised in a bottom of the first housing receiving the plug.

14. The electrical equipment according to claim 9, comprising a sealing system according to claim 4.

15. The sealing system according to claim 2, in which the base and the plug form an independent assembly configured to be transferred onto a frame of the electrical equipment.

16. The sealing system according to claim 3, in which the base and the plug form an independent assembly configured to be transferred onto a frame of the electrical equipment.

17. The sealing system according to claim 4, in which the base and the plug form an independent assembly configured to be transferred onto a frame of the electrical equipment.

18. The electrical equipment according to claim 7, comprising a bearing forming a part of the frame of said electrical equipment, said bearing having a first housing containing said sealing system.

19. The electrical equipment according to claim 8, comprising a bearing forming a part of the frame of said electrical equipment, said bearing having a first housing containing said sealing system.

20. A method for sealing an electrical equipment according to claim 9, said method being configured to seal a cavity arranged in a bearing forming a part of the frame of said electrical equipment, the method comprising the steps:
    of insertion of the projecting part of the plug into the orifice of the base,
    of insertion of each cable of the bundle of cables into a hole of the plug,
    of insertion of the assembly comprising the plug, the base and the bundle of cables into the first housing of the bearing,
    of fixing the cover on the bearing such that the edges of the through opening of the cover are supported on the second plate of the plug.

* * * * *